United States Patent [19]

Countryman, Jr.

[11] Patent Number: 4,465,973

[45] Date of Patent: Aug. 14, 1984

[54] PAD FOR ACCELERATED MEMORY TEST

[75] Inventor: Roger S. Countryman, Jr., Austin, Tex.

[73] Assignee: Motorola, Inc., Schaumburg, Ill.

[21] Appl. No.: 378,555

[22] Filed: May 17, 1982

[51] Int. Cl.³ ............................................. G01R 31/00
[52] U.S. Cl. .................................. 324/158 R; 324/54; 324/73 R
[58] Field of Search ................... 350/54, 73 R, 158 R; 29/574; 371/21

[56] References Cited

U.S. PATENT DOCUMENTS 4,004,222 1/1977 Gebhard ......................... 324/158 R

FOREIGN PATENT DOCUMENTS 1305010 1/1973 United Kingdom ............. 324/73 R
847234 7/1981 U.S.S.R. .................................. 324/54

OTHER PUBLICATIONS

"Equipment for Checking Dielectric Losses in Silicon Matrices with Dielectric Material" in Izmeritel'naga Tekhnika, No. 1, pp. 61–62, Jun. 1979, by Oksanich et al.
"Capacitor/Thin-Film Stress Test Circuit" in IBM Tech. Disc., vol. 18, No. 3, pp. 813–814, Aug. 75, by Franco et al.

Primary Examiner—Stewart J. Levy
Attorney, Agent, or Firm—James L. Clingan, Jr.

[57] ABSTRACT

In a memory array of capacitive storage cells having first and second polysilicon layers, an accelerated test for defects in insulating layers between substrate and first polysilicon and between first and second polysilicon is made possible by providing a probe pad which is connected to the connection between the first polysilicon and a resistor. The test is further facilitated by replacing the normally diffused resistor by a polysilicon resistor.

7 Claims, 2 Drawing Figures

PAD FOR ACCELERATED MEMORY TEST

FIELD OF THE INVENTION

This invention relates, in general, to accelerated testing of semiconductors, and more particularly to accelerated testing of semiconductor memory arrays.

BACKGROUND OF THE INVENTION

In semiconductor memory arrays reliability is extremely important. A manufacturer typically must test each device at some length before being satisfied that the memory is of sufficient quality to place into a system. Because some failures are the result of marginal defects, i.e., defects which may not cause a device failure for even thousands of hours of normal operation, it is a continuing desire to find ways to accelerate the device failure due to a marginal defect. It is known that such acceleration can be achieved by increasing one or more of temperature, current, and voltage parameters beyond the normal operating range. In a memory array having a first polysilicon layer over portions of a substrate and separated therefrom by a first oxide layer and a second polysilicon layer over portions of the first polysilicon layer and separated therefrom by a second oxide layer, marginal defects in the first or second oxide may not result in device failure until after thousands of hours of operations. Currently, the test for such marginal defects is accelerated by a burn-in technique in which power is applied to the device in an environment with a substantially increased temperature. Nonetheless, in order to achieve the required reliability, burn-in may take days. Another disadvantage of burn-in is that the device has already been packaged. Consequently a detected failure is more costly because the cost of packaging is also lost.

SUMMARY OF THE INVENTION

An object of this invention is to provide a memory to which an improved accelerated insulating layer test can be applied.

Another object of the invention is to provide a memory which can have an insulating layer tested at a probe stage.

Yet another object of the invention is to provide an improved accelerated test for an insulating layer in a memory.

These and other objects of the invention are accomplished by a semiconductor memory with capacitive storage elements which comprises: a first conductive layer forming a first electrode of the capacitive storage elements separated from the substrate by a first insulating layer; a second conductive layer separated from the first conductive layer by a second insulating layer; a polysilicon resistor having a first terminal coupled to the first conductive layer and a second terminal coupled to a power supply terminal; and a test pad connected to the first conductive layer for application of a test voltage to test the first and second insulating layers.

DESCRIPTION OF A PREFERRED EMBODIMENT

Figure 1:
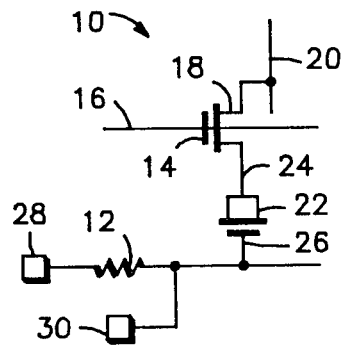
FIG. 1 shows in schematic form a typical memory cell with test connections according to a preferred embodiment of the invention.

Shown in FIG. 1 is a typical memory cell 10 of a memory array coupled to a polysilicon resistor 12. Cell 10 has a transfer gate 14 connected to a word line 16, and output node 18 connected to a bit line 20, and a storage capacitor 22 for coupling a charge stored therein from a terminal 24 thereof to output node 18 in response to receiving a positive signal on transfer gate 14. Capacitor 22 has a terminal 26 connected to a first terminal of resistor 12. A second terminal of resistor 12 is connected to a bonding pad 28 for receiving a power supply voltage, such as 12 volts. A test pad 30 is connected to the first terminal of resistor 12 and terminal 26 of capacitor 22. In an array of memory cells in which cell 10 is a typical cell, bit line 20 will be connected to the output node of other cells in a column and word line 16 will be connected to the transfer gates of cells of a row. The array will have a plurality of rows and columns with associated word lines and bit lines, respectively. All of the second terminals of the storage capacitors will be connected to the first terminal of resistor 12.

Figure 2:
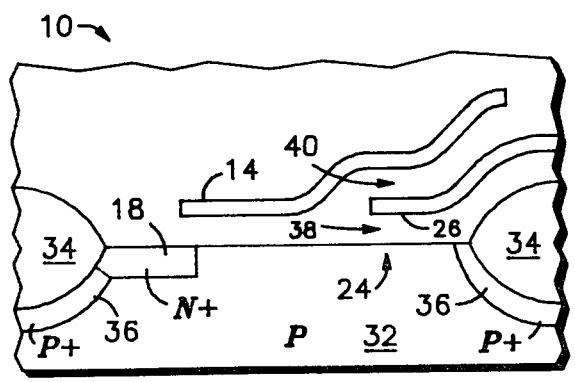
FIG. 2 is a cross section of a relevant portion of the memory cell of FIG. 1 useful for understanding the preferred embodiment.

Shown in FIG. 2 is a cross section of cell 10 showing a substrate 32 of P type material, output node 18 of N type material, transfer gate 14, terminal 26 of capacitor 22, terminal 24 of capacitor 22 which is actually a region in substrate 32 directly under terminal 26, field oxide 34, and channel stop regions 36. Terminal 26 is formed of a first conductive layer of polysilicon over substrate 32 and separated therefrom by a first insulating layer 38 of oxide. Transfer gate 14 is formed of a second conductive layer of polysilicon an extended portion of which is over the first conductive layer and separated therefrom by a second insulating layer 40 of oxide.

In the prior art, resistor 12 was formed by an N type diffusion in the substrate. This was effective for providing a resistance of sufficient accuracy while occupying a relatively small area. In the preferred embodiment, however, resistor 12 is a polysilicon resistor which can be formed in a conventional manner. Some other surface resistor which is insulated from substrate 32 by an insulating layer, such as field oxide 34, could be used as well. Using polysilicon resistor 12 instead of a diffused resistor allows for accelerated testing of insulating layers 38 and 40 with a test voltage technique instead of the burn-in technique of the prior art. By applying a test voltage to test pad 30, the test voltage is applied to the first conductive layer which is terminal 26 of capacitor 22 as well as the second terminal of the storage capacitor of the other cells in the array. While applying the test voltage at test pad 30, the power supply voltage can be applied at bonding pad 28. This allows for circuitry which is powered by the power supply voltage at pad 28 to operate while the test voltage is applied at pad 30. The difference in voltage between the power supply voltage and the test voltage will generate current through resistor 12. A typical resistance for resistor 12 is 4 K ohms. Consequently, with a voltage difference of, for example, 50 volts, the current will be only 12.5 ma which resistor 12 can be easily made, by conventional means, to conduct.

The application of the test voltage at test pad 30 is designed to test the integrity of the first and second insulating layers 38 and 40. In normal operation terminal 26 will be held at only 12 volts. With a marginal defect in first or second insulating layers 38 or 40, the memory cell 10 may operate properly for even thousands of hours before failing. By applying the test voltage at a level which is substantially larger than the normal operating voltage, the marginal defects will cause device failure much sooner, in the order of seconds or even less than a second compared to thousands of hours. After application of the test voltage, failures are detected by a conventional functional test of the device. As the magnitude of the test voltage is increased, the acceleration of device failure due to marginal defects is increased. There is a limitation for increasing the magnitude of the applied test voltage. Even in the absence of defects there is a breakdown voltage of the first and second insulating layers 38 and 40 which should not exceeded. If this breakdown voltage of either the first or second insulating layer 38 or 40 is exceeded, failures will be created even in the absence of defects, i.e., good parts will be ruined. The breakdown voltage of insulating layers 38 and 40 is a well known function of insulating material and depth.

For cell 10 the test voltage is chosen to be −40 volts while holding the substrate 32 and second polysilicon layer, shown as transfer gate 14 in FIGS. 1 and 2, at ground. A negative voltage is used to ensure that the entire test voltage is applied across first insulating layer 38. If a positive test voltage is used, there will be some voltage differential developed between a space charge region (terminal 24 in FIGS. 1 and 2) under the first polysilicon layer (terminal 26) and substrate 32. Consequently, for a positive test voltage a somewhat larger voltage in magnitude is required in order to obtain the same voltage differential across first insulating layer 38. If resistor 12 were a diffused N type resistor in substrate 32 as in the prior art, the negative test voltage could not be used because that would forward bias a PN junction formed between the diffused resistor and substrate 32. Although a positive test voltage could be applied to the diffused resistor, the magnitude of the test voltage would be severely limited by a reverse bias breakdown voltage of the PN junction formed between the diffused resistor and substrate 32. Such reverse bias breakdown voltage can be as low as 20 volts which limitation would severely limit the acceleration aspect of detecting marginal defects.

An advantage of using a test voltage applied to pad 30 to test first and second insulating layers 38 and 40 instead of a burn-in technique is that the test can be performed by probing while in wafer form. It is desirable to detect as many defects as is possible at the probe stage in order to avoid packaging bad parts. Consequently, by making the connection between the first polysilicon layer and resistor 12 available to be probed, by virtue of pad 30, the test for defects in first and second insulating layers 38 and 40 is performed prior to packaging.

While the invention has been described in a preferred embodiment, it will be apparent to those skilled in the art that the disclosed invention may be modified in numerous ways and may assume many embodiments other than that specifically set out and described above. For example, power supply pad 28 could be connected to some other potential, such as ground, instead of 12 volts for a capacitive storage element of a somewhat different design while still using the invention taught herein. Accordingly, it is intended by the appended claims to cover all modifications of the invention which fall within the true spirit and scope of the invention.

I claim:

1. A semiconductor memory having capacitive storage elements on a substrate in which each capacitive storage element has first and second electrodes, the first electrode for coupling to a bit line, comprising:
    a polysilicon resistor coupling a power supply bonding pad to the second electrode of the capacitive storage elements;
    an insulating layer between the second electrode and the substrate; and
    a test pad connected to the one electrode to facilitate performing an insulating layer integrity test.

2. The semiconductor memory of claim 1 wherein the integrity test provides a test voltage across the insulating layer without subjecting other nodes of the memory to abnormal voltages.

3. A method of testing a memory array having capacitive storage elements for oxide failures in which each capacitive storage element has a first electrode for receiving data, and a second electrode, comprising the steps of:
    providing a polysilicon resistor between the second electrode of the capacitive storage elements and a power supply bonding pad; and
    applying a first voltage to the power supply bonding pad; and
    applying a second voltage to the second electrode of the capacitive storage elements through a test pad directly connected to the second electrode.

4. A semiconductor memory with capacitive storage cells formed on a substrate in which each capacitive storage element has a first electrode for receiving data, and a second electrode, comprising:
    a first conductive layer forming the second electrode of the capacitive storage elements separated from the substrate by a first insulating layer;
    a second conductive layer separated from said first conductive layer by a second insulating layer;
    a surface resistor insulated from the substrate having a first terminal coupled to said first conduction layer and a second terminal coupled to a power supply terminal; and
    a test pad connected to said first conductive layer for application of a test voltage to test the first and second insulating layers.

5. The semiconductor memory of claim 4 wherein the test voltage is a negative voltage.

6. The semiconductor memory of claim 4 or 5 wherein the substrate is of a first conductivity type having regions of a second conductivity type therein forming PN junctions between said regions and the substrate having a reverse bias breakdown voltage associated therewith and wherein the test voltage is of a greater magnitude than the magnitude of the reverse bias breakdown voltage.

7. The semiconductor memory of claim 4 or 5 wherein the surface resistor is a polysilicon resistor.

* * * * *